United States Patent
Bean (10) Patent No.: US 8,859,992 B2
(45) Date of Patent: Oct. 14, 2014

(54) CHARGED PARTICLE BEAM DEVICES

(75) Inventor: Stewart John Bean, Wyton (GB)

(73) Assignee: Carl Zeiss NTS Limited, Cambridge (GB)

( * ) Notice: Subject to any disclaimer, the term of this patent is extended or adjusted under 35 U.S.C. 154(b) by 357 days.

(21) Appl. No.: 13/273,458

(22) Filed: Oct. 14, 2011

(65) Prior Publication Data

US 2012/0091337 A1 Apr. 19, 2012

(30) Foreign Application Priority Data

Oct. 14, 2010 (GB) .................................. 1017342.5

(51) Int. Cl.
*H01J 37/18* (2006.01)
*H01J 37/28* (2006.01)

(52) U.S. Cl.
CPC ......... *H01J 37/28* (2013.01); *H01J 2237/1415* (2013.01); *H01J 2237/2608* (2013.01); *H01J 2237/188* (2013.01); *H01J 2237/022* (2013.01); *H01J 37/18* (2013.01)
USPC ..................................... 250/441.11; 250/310

(58) Field of Classification Search
CPC ...................................................... H01J 37/18
See application file for complete search history.

(56) References Cited

U.S. PATENT DOCUMENTS

| 3,156,811 A | 11/1964 | Barry |
| 4,823,006 A * | 4/1989 | Danilatos et al. ............. 250/310 |
| 6,555,815 B2 * | 4/2003 | Feuerbaum et al. .......... 250/306 |
| 6,707,041 B2 | 3/2004 | Essers |
| 7,804,066 B2 * | 9/2010 | Ogawa et al. ................. 250/306 |
| 2006/0016988 A1 | 1/2006 | Petrov et al. |
| 2007/0187622 A1 | 8/2007 | Nagano |
| 2009/0314939 A1 | 12/2009 | Stern et al. |

FOREIGN PATENT DOCUMENTS

| EP | 1047104 A1 | 10/2000 |
| EP | 1826808 A1 | 8/2007 |
| GB | 1010307 A | 11/1965 |
| GB | 1058281 A | 2/1967 |
| GB | 1058568 A | 2/1967 |
| GB | 1120864 A | 7/1968 |

(Continued)

OTHER PUBLICATIONS

English language abstract of Japanese Patent Publication No. JP 55068191 A, downloaded from http://worldwide.espacenet.com Oct. 19, 2011.

(Continued)

*Primary Examiner* — Jack Berman
(74) *Attorney, Agent, or Firm* — DASCENZO Intellectual Property Law, P.C.

(57) ABSTRACT

In a charged particle beam device, such as an electron microscope, a beam generating apparatus generates a focussed charged particle beam e– that is incident on a specimen in a specimen chamber which holds the specimen in a gaseous environment. A pressure limiting aperture provides partial gaseous isolation of the specimen chamber from the beam generating means, and is located in a lens of the latter. The device includes a conduit, such as an intermediate chamber in the lens, through which, in use, gas is supplied to set up a flow of gas from the region of the lens towards the specimen, thereby to prevent material released from the specimen from impinging on the pressure limiting aperture, to prevent contamination of the latter. The device can be used in a method of scanning a specimen with a charged particle beam, for example in a method of electron microscopy.

23 Claims, 5 Drawing Sheets

(56) References Cited

FOREIGN PATENT DOCUMENTS

| | | |
|---|---|---|
| GB | 1159565 A | 7/1969 |
| JP | 55068191 A | 5/1980 |
| JP | 56056791 A | 5/1981 |
| WO | WO 99/27259 | 6/1999 |
| WO | WO 2009/068904 | 6/2000 |
| WO | WO 01/03145 | 1/2001 |
| WO | WO 02/15224 | 2/2002 |

OTHER PUBLICATIONS

English language abstract of Japanese Patent Publication No. JP 56056791 A, downloaded from http://worldwide.espacenet.com Oct. 19, 2011.

* cited by examiner

CHARGED PARTICLE BEAM DEVICES

CROSS-REFERENCE TO RELATED APPLICATION

The present application claim priority under 35 U.S.C. §119 to United Kingdom Patent Application Serial No. 1017342.5, which was filed on Oct. 14, 2010, and the complete disclosure of which is hereby incorporated by reference.

FIELD OF THE DISCLOSURE

This invention relates to a charged particle beam device and a method of subjecting a specimen to a charged particle beam. The invention also relates to a method of scanning a charged particle beam over a specimen and to a method of electron microscopy.

BACKGROUND OF THE DISCLOSURE

The invention is particularly applicable to electron microscopes of the type in which a specimen to be analysed is held within a gaseous environment contained in a specimen chamber and to the analysis of specimens which may outgas or shed particles in response to the impact of the primary electron beam. The gaseous environment avoids or mitigates certain of the problems which arise from analysing a specimen in high vacuum. For example, the environment may prevent or inhibit degradation of biological specimens, and can help to dissipate surface charges which would otherwise accumulate on a non-conducting specimen, to the detriment of image resolution.

Some scanning electron microscopes can obtain images of a specimen in a gaseous environment in which relatively high pressures are maintained. Such pressures can be at least the vapour pressure of water at room temperature, and in some cases the facility to operate at pressures up to one atmosphere in the specimen chamber is claimed.

However, a relatively high vacuum needs to be maintained in the electron optical column of the microscopes, and to that end the microscopes are generally equipped with differential pumping stages comprising at least two spaced apart pressure limiting apertures (through which the beam passes) which operate in conjunction with one or more vacuum pumps connected to the space between the apertures and the region above the upper pressure limiting aperture. Most of the gas which passes from the specimen chamber through the lower aperture is pumped out of the space between the two apertures. Some gas may escape from this region through the upper limiting pressure aperture, but this will then be removed by the pump connected to the region above that aperture.

An electron optical column may include further pumping stages in order to achieve a higher vacuum in the column, depending on the type of electron source used in the column.

The two pressure limiting apertures will normally be mounted on or in the final electromagnetic lens assembly of the electron optical column, which will have scanning coils or electrodes located just upstream (in the beam direction) of the upper pressure limiting aperture. This means that the lower aperture may limit the field of view of the electron microscope. In addition, the relatively high number density of gas molecules in the specimen chamber limits the mean free path of electrons in the beam, and hence correspondingly limits the working distance of the microscope.

Many microscopes can operate in a "variable pressure" mode (VP mode), in which lower pressures in the specimen chamber are used. In such a mode, the microscope can have a greater working distance and the lower of the two pressure limiting apertures may be omitted or (in the case of a reconfigurable microscope) removed. The field of view is no longer limited by the lower aperture, but molecules or particles ejected from the specimen by the beam can accumulate around the remaining pressure limiting aperture to cause contamination of the latter or of the column parts located upstream (relative to the beam direction) of the aperture. Such contamination of the aperture may, for example, give rise to the accumulation of electrostatic charges that are detrimental to image quality.

Similar accumulations can occur on the lower aperture of a microscope operating in an ESEM mode, but that aperture can readily be removed for cleaning. However, the aperture of a microscope operating in variable pressure mode may be recessed within the final lens assembly, and so may be relatively inaccessible.

U.S. Pat. No. 3,156,811 and GB 1120864 show particle beam aparatusses which are designed for performing various operations (for example drilling or welding) on workpieces, and which use a flow of gas through the final orifice through which the particle beam passes to attempt to keep that orifice clean. In these cases, however, the orifice has to be incorporated into an attachment for the final lens which attachment is specifically designed to provide the gas flow and which increases the minimum permissible distance between the actual lens and the workpiece. It is also believed that, despite the flow of cleaning gas, contaminants can accumulate on the lower surface of an attachment, in the region of the orifice.

SUMMARY OF THE DISCLOSURE

According to a first aspect of the invention, there is provided a charged particle beam device comprising beam generating means for generating a focussed charged particle beam; a specimen chamber for containing a specimen to interact with the beam in a gaseous environment; a pressure limiting aperture for providing partial gaseous isolation of the specimen chamber from the beam generating means, the beam generating means having a lens for focussing the beam, which lens includes an intermediate chamber, wherein the device further includes gas inlet means for enabling gas to be supplied to the intermediate chamber to set up a flow of gas from the lens towards a specimen, thereby to prevent material released from the specimen from impinging on the pressure limiting aperture.

Preferably, the lens is so shaped that said flow of gas impinges directly on the specimen.

Preferably, the device is a scanning beam device, the beam generating means including means for scanning the beam over the specimen.

It is known for scanning charged particle beam devices to have staged pumping systems in which final lenses include intermediate pressure chambers extending between upstream and downstream pressure limiting apertures. Such a chamber is connected to a vacuum pump and helps to achieve gaseous isolation between the specimen chamber and the beam generating means, by enabling gas which passes through the downstream limiting aperture from the specimen chamber into the intermediate chamber to be removed from the intermediate chamber instead of then passing through the upstream pressure limiting aperture. Thus a relatively high pressure may be maintained in the specimen chamber, with the pressure in the intermediate chamber being lower than that in the specimen chamber and higher than that in the beam generating means.

It is relatively straightforward to modify such a device to implement the present invention. The modification can be achieved by removing the lower, downstream aperture and connecting the intermediate chamber to a gas supply. Such a modification enables the existing structure of the lens to act as a conduit for the gas that prevents contamination of the remaining aperture when the gas pressure in the specimen chamber is lower than that in the intermediate chamber. In addition, the modification does not increase the working distance of the device.

Preferably, the lens comprises an assembly having an upper pole piece and a lower pole piece, the pole pieces being spaced from each other to enable the assembly to accommodate the intermediate chamber.

Conveniently, in this case, the pole pieces define the intermediate chamber.

The intermediate chamber may to advantage be interposed between the pressure limiting aperture and a beam outlet opening, through which the beam exits the lens, and through which the gas flows from the intermediate chamber and into the specimen chamber.

Thus the flow of gas for keeping the pressure limiting aperture clean is not restricted (in terms of volume or spatial distribution) by having to pass through the aperture itself. Instead, the flow of gas can pass from the sides of the member defining the aperture and out of the beam outlet opening in such a way that the flow is distributed across substantially all of the opening. This type of flow is particularly effective at preventing gas molecules released from the specimen from penetrating the opening and thus from reaching the pressure limiting aperture or the surfaces surrounding it.

Preferably, the intermediate chamber is annular.

This shape of chamber is particularly effective at establishing an even flow of gas out of the beam outlet opening.

Preferably, the beam outlet opening is able to receive a second, downstream pressure limiting aperture, and the intermediate chamber is connectable to a vacuum pump operable, with said gas supply interrupted, to maintain the pressure of gas in the intermediate chamber at a level lower than that in the specimen chamber.

To that end, the lens may include a screw threaded portion for releasably receiving a correspondingly screw threaded aperture holder for holding said second pressure limiting aperture. These components are fitted together in such a way that gas can pass only through the aperture opening. To that end, the aperture and holder may be vacuum sealed.

Thus the device can be configured to operate as an extended pressure device, in which relatively high gas pressures can be maintained in the specimen chamber, because of the improved gaseous isolation of the beam generating means from that chamber achieved by having two pressure limiting apertures and a pumped intermediate chamber therebetween.

In such an operating mode, there is no net flow gas from the lens towards the specimen, but the aperture more likely to be contaminated by gas or particles from the sample is the lower, second aperture, which in any case is more accessible than the other pressure limiting aperture and therefore easier to clean. Any contamination of the other aperture will be much lower (possibly negligible) due to the pumping of the intermediate vacuum area provided by the intermediate chamber, and the lower vacuum pressure in the intermediate vacuum area.

Preferably, the gas inlet means comprises a valve connected between the intermediate chamber and a gas source.

The gas source may comprise atmospheric air (the inlet valve being open to the atmosphere) or a gas container, for example a gas cylinder, containing a gas or a mixture of gases.

Said gas or mixture may, for example, comprise air, dry air, water vapour or a noble gas.

Preferably, the intermediate chamber has a substantially constant cross-sectional area at least in the region extending from the location at which the gas is introduced to the opening.

Such a shape of chamber therefore lacks any throat that would accelerate the flow of gas through the opening.

This facilitates a subsonic flow of gas in the intermediate chamber and into the specimen chamber. Such a flow, in general, helps to ensure that the flow of gas into the specimen chamber does not disrupt the specimen.

The flow rate of gas through the intermediate chamber may also be sufficiently large to act as a means for controlling the pressure in the specimen chamber.

Preferably, the device comprises a charged particle scanning beam imaging instrument, preferably an electron microscope, in which the beam generating means takes the form of an electron optical column of the microscope.

Preferably, the electron microscope is a variable pressure electron microscope operable to obtain an image of a specimen when the gas pressure in the chamber is in the range 1 Pa-400 Pa.

According to a second aspect of the invention, there is provided a method of subjecting a specimen to a charged particle beam, the method comprising the steps of:
(a) maintaining a gas pressure of at least 1 Pa in the environment contained by a specimen chamber which also contains the specimen;
(b) generating a focussed charged particle beam using beam generating means which is partially gaseously isolated from the specimen chamber by at least one pressure limiting aperture through which the beam passes on its way to the specimen chamber to interact with the specimen therein,
wherein the method further includes the step of introducing gas into the specimen chamber through a conduit having an outlet for said gas situated downstream, in the direction of the beam, from the pressure limiting aperture, to create a flow of gas generally away from the aperture and towards a specimen, so as to prevent material released from the specimen from impinging on the aperture.

Since the gas flow does not involve the passage of gas through the pressure limiting aperture, the spatial distribution and volume of flowing gas is not restricted by that aperture. The flow of gas can thus effectively prevent or inhibit contamination caused by the accumulation of molecules or particles emitted from the specimen or from the surfaces in the specimen chamber around the aperture, whereas a flow of gas through the aperture would be less effective at preventing such accumulations.

Preferably, the flow of gas is subsonic.

Preferably, the flow rate of the gas into the specimen chamber is 20 slpm (standard liters per minute), and is sufficient to maintain the desired specimen chamber pressure.

Such a flow rate has been found to be sufficient for protecting the pressure limiting aperture, whilst allowing the specimen to be placed at a relatively short distance from the aperture without being disrupted by the flow of gas.

Preferably, the gas pressure maintained in the specimen chamber is in the region of 1 Pa to 400 Pa.

This pressure range makes the method suitable for use in a method of variable pressure electron microscopy.

The method may be performed using a device in accordance with a first aspect of the invention, in which case the conduit comprises the intermediate chamber, the outlet of the conduit being the beam outlet opening in the intermediate chamber.

In this case, the gas pressure in the intermediate chamber is possibly between 4 and 10 Pa higher than the gas pressure in the specimen chamber.

The conduit need not comprise an intermediate chamber in a lens, but could instead extend into the specimen chamber, at a position spaced from the lens.

In this case, the conduit may comprise a pipe.

The outlet may comprise an annular port surrounding the beam path.

Alternatively, the outlet may comprise a port situated on one side of the beam path.

Preferably, the effusion of gas into the specimen chamber through said conduit and outlet is also used to control the gas pressure in the specimen chamber.

In this case, the specimen chamber may be connected to a vacuum pump for extracting gas from that chamber.

Thus, at a given constant pressure, the gas in the specimen chamber will be in a dynamic equilibrium, with a rate of extraction of gas via the vacuum pump being matched by the rate of introduction of gas through the conduit.

That pressure can be increased or decreased respectively by increasing or decreasing the rate of introduction of gas with conduit.

According to a third aspect of the invention, there is provided a method of scanning a charged particle beam over a specimen, the method comprising subjecting the specimen to the beam by a method in accordance with the second aspect of the invention, to create a focussed charged particle beam which is incident on the specimen, and causing the scanning of the specimen by the beam (for example by scanning the beam across the specimen or moving the specimen relative to the beam).

The invention also lies in a method of creating an image of a specimen, comprising scanning the specimen by a method in accordance with the third aspect of the invention and detecting resultant emissions from or by the specimen.

This method may be used in a method of electron microscopy, the emissions comprising secondary electrons, back scattered electrons or emitted photons from the sample or photons emitted by the interaction of the secondary electrons or backscattered electrons with the gas molecules of the specimen chamber.

BRIEF DESCRIPTION OF THE DRAWINGS

The invention will now be described, by way of example only, with reference to the accompanying drawings in which.

DETAILED DESCRIPTION OF THE DISCLOSURE

Figure 1:
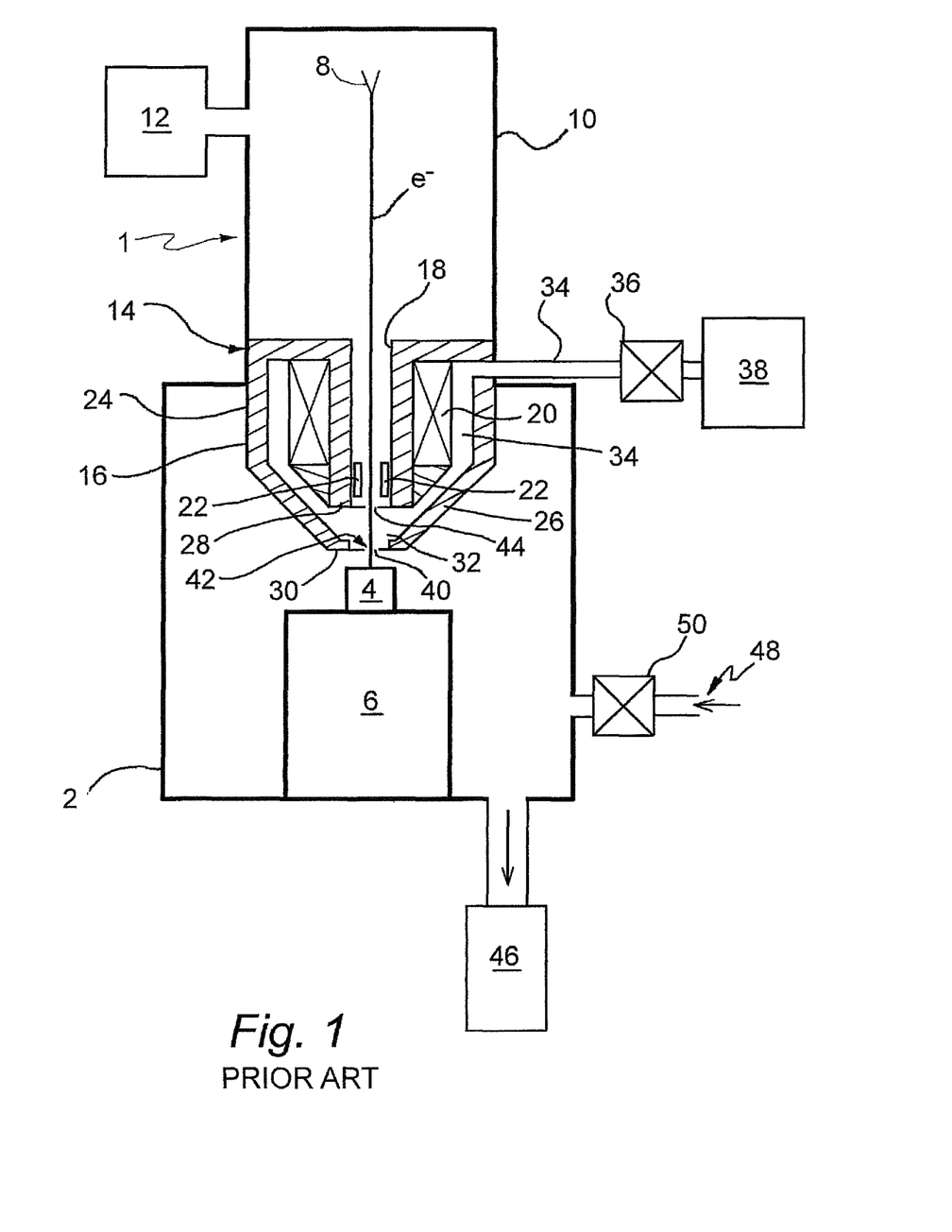
FIG. 1 is a schematic sectional side view of a conventional extended pressure scanning electron microscope (ESEM)

The electron microscope shown in FIG. 1 comprises an electron optical column generally referenced 1 for generating a focussed scanning beam of electrons which enters a specimen chamber 2 to scan a specimen 4 supported on a holding stage 6 in the chamber 2. At the top of the electron optical column there is provided a tungsten emitter 8 which generates electrons by a process of thermionic emission. Those electrons are then accelerated and focussed to form a beam of a predetermined diameter by means of electrodes and magnetic lenses which for the sake of clarity have been omitted from FIG. 1. These components are contained in the upper portion 10 of the column, which also includes a tube (not shown) through which the beam passes. That tube is connected to a first vacuum pump 12 which is operable to maintain a pressure (P3) of between $1\times10^{-1}$ Pa to $1\times10^{-4}$ Pa. The components in the upper portion of the electron optical column are known from, for example, WO 1998/022971 A2 (FIG. 1 and FIG. 2) or WO 2002/086942 A1 (FIG. 1).

Attached to the bottom of the upper portion 10 is a final, objective lens generally referenced 14 comprising a magnetic lens assembly having a ferromagnetic pole piece 16 having an inner cylindrical core 18 which carries a focussing coil 20. Scanning coils 22 are also provided in the cylindrical core of the pole piece.

The pole piece 16 includes an outer jacket having a cylindrical upper portion 24 and a frusto-conical lower portion 26. The pole piece 16 is formed from ferromagnetic material and defines an upper pole piece 28 at the base of the core 18 and a lower pole piece 30 at the base of the portion 26. As can be seen from FIG. 1, the jacket 24 and 26 is spaced from the coils 20 and 22 and the upper and lower pole pieces are spaced from each other to define an intermediate chamber 32 within the lens 14. The intermediate chamber 32 is connected via a conduit 34 and control valve 36 to a second vacuum pump 38 for extracting gas from the intermediate chamber 32. A diaphragm which carries a lower pressure limiting aperture 40 extends across the lower pole piece to achieve partial occlusion of the beam exit opening 42 in the lower pole piece. Similarly, the opening in the upper pole piece 28 is partially occluded by a diaphragm which carries an upper pressure limiting aperture 44 that provides partial gaseous isolation of the intermediate chamber 32 from the upper portion 10 of the column 1. The upper aperture 44 has a diameter which is typically in the range of 150 to 250 μm, whilst the diameter of the lower aperture 40 is typically in the range 0.4 to 1.0 mm. FIGS. 2 and 3 of WO 2002/086942 A1 show a possible alternative aperture assembly.

The pressure in the chamber 2 is controlled by means of a further vacuum pump 46 and a gas source 48 for supplying gas to the chamber 2 via a control valve 50. In use, the pressure in the specimen chamber 2 is first reduced, using the pump 46 to a pressure (P1) in the range of 200 Pa to 3000 Pa. This involves measuring the pressure using a vacuum gauge (not shown) and, as the pump 46 continues to operate, adjusting the valve 50 to allow a controlled amount of gas into the chamber 2 to maintain the desired gas pressure in the latter. At the same time, the valve 36 is open and the pump 38 operates to extract from the intermediate chamber 32 gas which has entered the latter via the lower pressure limiting aperture 40.

The pump 38, in use, maintains a gas pressure (P2) of approximately 2 Pa to 30 Pa in the intermediate chamber 32.

Any gas which does pass from the intermediate chamber 32 into the upper portion 10 can be evacuated using the pump 12 to maintain the pressure (P3) in the latter in the range mentioned above.

The microscope of FIG. 1 (and each of the microscopes shown in FIGS. 2-5) also includes one or more detectors (not shown) for detecting emissions from the sample 4 resulting from its interaction with the electron beam. For the present purposes, such emissions include secondary electrons released from the sample, back scattered primary electrons (i.e. electrons from the beam) and/or photons emitted from the sample or by the interaction between secondary or back-scattered electrons and gas molecules in the specimen chamber. The type of detector will depend on the type of imaging to be performed. For example, a simple electrode could detect back scattered electrons, whilst secondary electrons may be amplified using known gas amplification techniques and detected using a collector electrode connected to an electric current detector. Alternatively, a light guide and a photomultiplier tube can be used to detect photons emitted by the interaction of secondary or backscattered electrons with gas molecules in the specimen chamber.

The gas source 48 may be a gas cylinder containing air, dry air, nitrogen, water vapour, a noble gas or any other suitable gas or gases. The valve 50 will be adjusted by the system control or by user via a graphical user interface to enable the desired pressure P1 in the specimen chamber 2 to be achieved.

There is always a gas flow through the pressure limiting apertures from the areas with a higher vacuum pressure to the areas with the lower vacuum pressure. Therefore gas in the area between the sample and the lower pressure limiting aperture will penetrate through the pressure limiting aperture 40 into the intermediate chamber 32 which has a vacuum pressure P2 lower than the pressure in the specimen chamber. Any gas or particles from the specimen (e.g. hydrocarbons evaporated from the specimen) or from surfaces in the specimen chamber will also penetrate through the lower aperture 40 and may deposit around that aperture. This can lead to a contamination of the lower aperture 40 which in turn may cause electrostatic charges to influence the quality of the imaging with the electron beam. Accordingly, the lower aperture 40 has to be cleaned from time-to-time, although it can be seen from the diagram that the aperture is relatively accessible.

Any contamination of the upper aperture 44 will be much lower and may even be negligible due to the pumping of the intermediate chamber 32 and a lower vacuum pressure in the area defined by that chamber.

Although the upper portion 10 is shown connected to just one vacuum pump, it is also known for the upper portion of an electron column to have multiple pumping stages, depending upon the type of electron emitter used in the column. If the emitter is a LaB6 emitter then the area which contains the emitter has to be pumped down to lower than $1\times10^{-4}$ Pa. For a Schottky field emitter, the vacuum in the emitter area must be lower than $1\times10^{-7}$ Pa and for a cold field emitter, the vacuum in the area of the emitter has to be lower than $1\times10^{-8}$ Pa. It is in order to be able to maintain the lower pressures that the additional pumping stages would be provided.

The mean free path length for electrons in the beam (which have an energy in the range 20 keV to 30 keV and pass through gas at a pressure of 500 Pa to 3000 Pa in a specimen chamber) is only in the range of a few millimeters (1-3 mm), and the specimen 4 therefore has to be positioned very close to the lower pressure limiting aperture 40. In addition, the aperture 40 can restrict the field of view of the microscope.

However, if lower pressures are used in the chamber 2, then a greater working distance is permitted and the lower pressure limiting aperture 40 can be removed. This arrangement is shown in FIG. 2.

Figure 2:
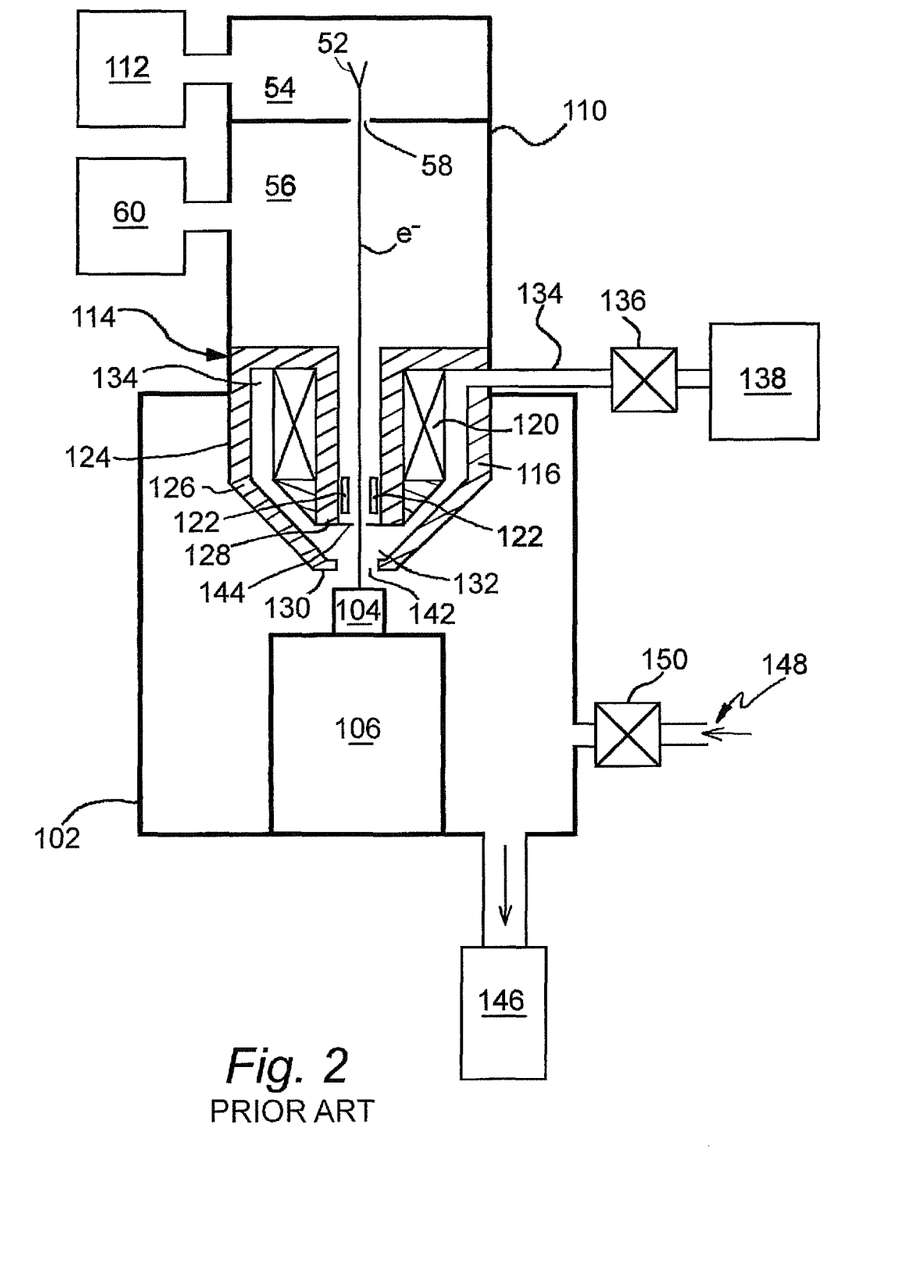
FIG. 2 is a corresponding view of a similar conventional microscope of the type adapted to operate in a variable pressure (VP) mode, in which a lower gas pressure is maintained in the specimen chamber.

The microscope shown in FIG. 2 is adapted to operate in a VP mode in which a specimen is imaged in a gaseous environment of a pressure (P1) in the range 1 Pa to 400 Pa. The electron microscope of FIG. 2 shares many features with the microscope of FIG. 1, and these are denoted by the reference numerals used in FIG. 1, raised by 100.

In this particular case, the emitter of electrons is an LaB6 or Schottky or a cold field emitter, and is denoted by reference number 52. This emitter needs to be held in a much higher vacuum than the tungsten emitter 8 shown in FIG. 1, and to enable this to be achieved, the upper portion 110 is divided into two pumping stages 54 and 56 which are separated by a further pressure limiting aperture 58, and are connected to the vacuum pumps 112 and 60 respectively.

In use, the pump 60 maintains a pressure P3, of about $1\times10^{-1}$ to $1\times10^{-4}$ Pa in the stage 56, whilst the pump 112 maintains a lower pressure, P4, of less than $1\times10^{-4}$ Pa for a LaB6 emitter, less than $1\times10^{-7}$ Pa for a Schottky field emitter or less than $1\times10^{-8}$ Pa for a cold field emitter.

The mean free path length for electrons in the energy range of 20 to 30 keV (i.e. electrons in the scanning beam) is about 10 mm for the range of pressures in VP mode in the specimen chamber 102 as described above. Consequently, the lower pressure limiting aperture has been removed, and the upper pressure limiting aperture 144 is still in the same place, but now separates the vacuum of the specimen chamber 102 from the vacuum of the portion of 110 of the electron optical column. The removed aperture, of course, no longer limits the field of view of the microscope, whilst the remaining aperture 144 has very little effect on the field of view because it is further away from the specimen 104 and (more importantly) because the deflection coils 122 are located just upstream of the aperture 144. Since the opening 142 into the intermediate chamber 132 is of about 5 mm diameter, it is too large to have any substantial pressure limiting effect. Thus the intermediate chamber 132 can no longer be maintained at a pressure which is significantly different from the pressure in the chamber 102, and the valve 136 is therefore closed and the pump 138 deactivated. The pressure in the chamber 102 is controlled by means of the gas source 148, valve 150 and pump 146 in the same fashion as is the case with the microscope shown in FIG. 1. As with the microscope of FIG. 1, the FIG. 2 example will also include some kind of detector for detecting emissions from the specimen 104.

In use, there will always be a flow of gas through the pressure limiting aperture 144 from the relatively high pressure environment in the chamber 102 to the lower pressure environment in pumping stage 56. Any gas or particles emitted from the specimen 104 (for example hydrocarbons evaporated from the specimen or any surfaces in the specimen chamber 102) can also penetrate the aperture 144 and may also be deposited around that aperture. This may lead to contamination of that aperture by matter that can give rise to electrostatic charges that will influence the quality of image obtained by the microscope. The aperture 144 will therefore need to be cleaned periodically. This is not an easy process because the aperture 144, being situated behind the opening 142, is not readily accessible.

Figure 3:
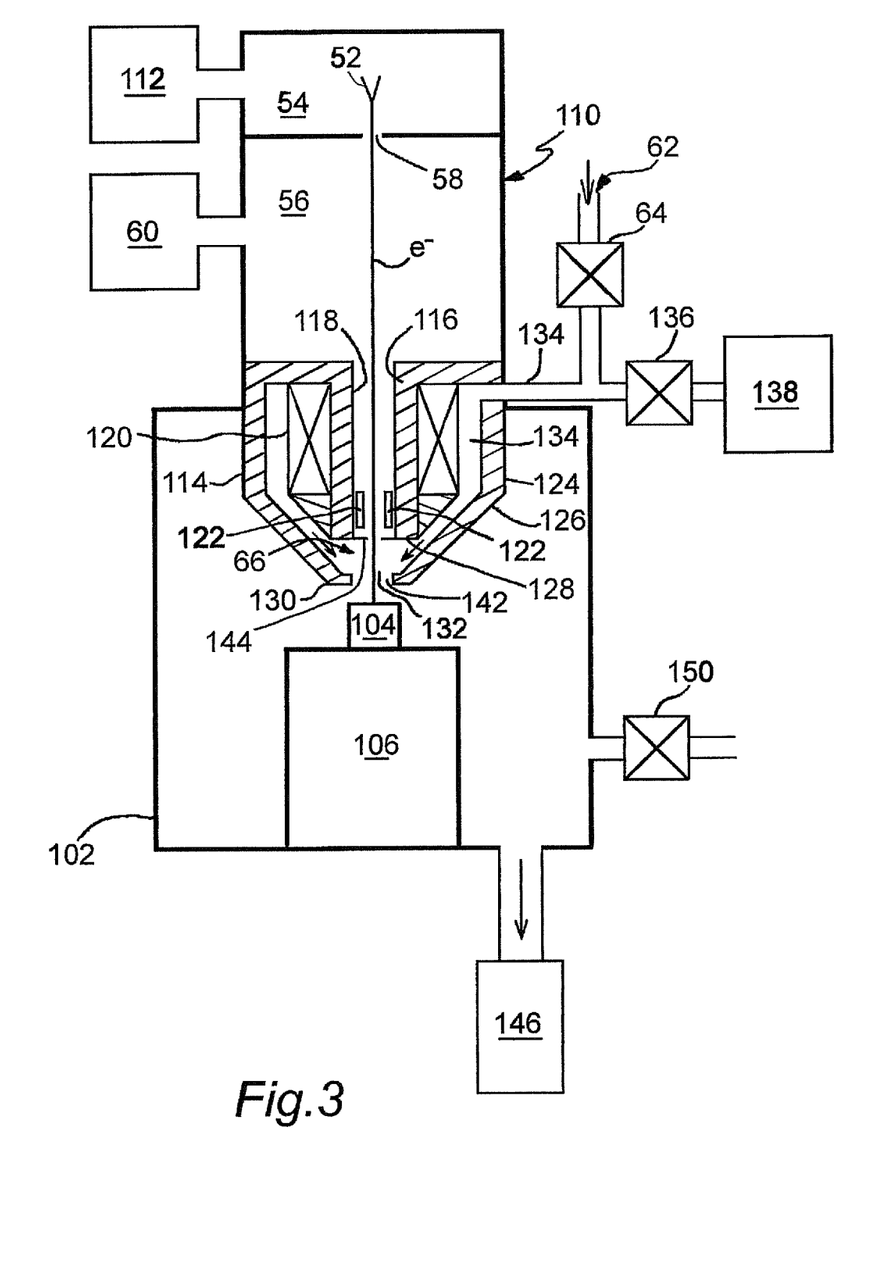
FIG. 3 is a corresponding view of a first embodiment of an electron microscope in accordance with the invention, in which gas for preventing contamination of the pressure limiting aperture is introduced into an intermediate chamber in the final lens of the microscope.

The first embodiment of electron microscope in accordance with the invention as shown in FIG. 3 shares many features with the electron microscope shown in FIG. 2, and these features are denoted by the same reference numerals as are used in FIG. 2. Indeed, the microscope in FIG. 3 could be obtained by making a modification to the microscope of FIG. 2.

That modification is the connection of a gas supply 62 to the inlet conduit 134 of the chamber 132, at a point just downstream of the valve 136. The gas supply 62 is connected to the conduit 134 via a valve 64 which can control the flow of gas from the source 62 into the intermediate chamber 132. The gas source 62 comprises a gas cylinder containing air, dry air, nitrogen, water vapour, a noble gas or any other gas or mixture of gases.

The flow of gas from the source 62 into the intermediate chamber 132 is used in the control of the pressure of gas in the chamber 102.

The operation of the device of FIG. 3 will now be described.

Initially, the chamber 102 is opened and a specimen 104 placed on the stage 106. The opening of the chamber exposes its interior to atmospheric pressure. Accordingly, after the chamber 102 has been closed and sealed, pump 146 is operated, along with the pumps 112 and 60, to reduce the pressures of gas in different parts of the device. While the pump 146 is operating, the valve 64 is also operating to admit a controlled amount of gas from the source 62 into the intermediate chamber 132. As this happens, the vacuum in the chamber 102 is measured by a vacuum gauge (not shown) and the valve 64 will be adjusted by the system control (or by a user via a graphical user interface) until the desired pressure P1 in the chamber 102 in the range 1 Pa to 400 Pa is achieved. The device includes a control system to ensure that the pumps 112 and 60 maintain the pressures of gas in stages 54 and 56 in the desired ranges for P3 and P4 discussed above. When the pressures in the chamber 102 and the stages 54 and 56 are substantially constant, the device is in a dynamic equilibrium in which the amount of gas introduced from the source 62 is matched by the amount of gas extracted by the vacuum pumps.

When the device is in this state, the pressure of gas in the intermediate chamber 132 will be at least 5 Pa and will in any case be higher than the pressure of gas in the specimen chamber 102. Consequently, gas will flow from the intermediate chamber 132 which is in the region 66 between the upper pole piece 128 and the lower pole piece 130, through the beam outlet opening 142 and towards and onto the specimen 104 and into the chamber 102.

As is indicated above, any hydrocarbons or other molecules may evaporate from the specimen 104 or from any surfaces in the specimen chamber 102. The interaction of the electron beam with the specimen may also cause an additional evaporation of hydrocarbons or other molecules from the specimen. However, the mean free path of those molecules at gas pressures of 10 Pa and higher is about 1 mm or lower. The mean free path to a gaseous environment at a pressure of 100 Pa will be 100 μm. Consequently, molecules moving towards the aperture 144 from the specimen 104 will normally undergo numerous scatterings. Moreover, the flow of gas from the intermediate chamber 132 through the opening 142 will prevent gas molecules from the specimen or chamber surfaces (e.g. evaporated hydrocarbons) from entering the chamber 132 through the opening 142, and thus from reaching the aperture 144 or the diaphragm in which it is formed. Since this flow of gas is initiated, in effect, in the space between the pole pieces, it is not impeded by having to pass through the aperture 144. This enables the flow of gas to be relatively evenly distributed across the opening 142, which helps to ensure that the aperture 144 is kept clean. If any gas molecules from the specimen 104 accumulate on the lower pole piece 130, they are unlikely to have a detrimental effect on the detected image because the relatively large size of the opening 142 means that the electron beam is unlikely to come close enough to the edges of the opening 142 to be affected.

In this particular example, the lower pole piece 130 includes a screw threaded portion in the opening 142 to enable an aperture holder for a lower pressure limiting aperture to be installed in the lens 114. If this is done, the device can be operated in a similar fashion to the device shown in FIG. 1 (under similar elevated pressures in the specimen chamber 102). In such a mode of operation, the valve 64 is closed and the gas pressure in the chamber 102 is controlled in the same way as is the device of FIG. 1 (i.e. using the valve 150 and pump 146). The intermediate chamber is then pumped down by opening valve 136 and switching on pump 138.

In an alternative embodiment, the electron optical column 110 and final lens 114 are substantially as shown in WO 02086942. In this case, gases for controlling the pressure in the specimen chamber and for setting up the flow of gas for preventing contamination is introduced into the space between the magnetic circuit (reference 360) and the lower plate (reference 400) with the lower aperture bearing member (reference 520) removed.

Figure 4:
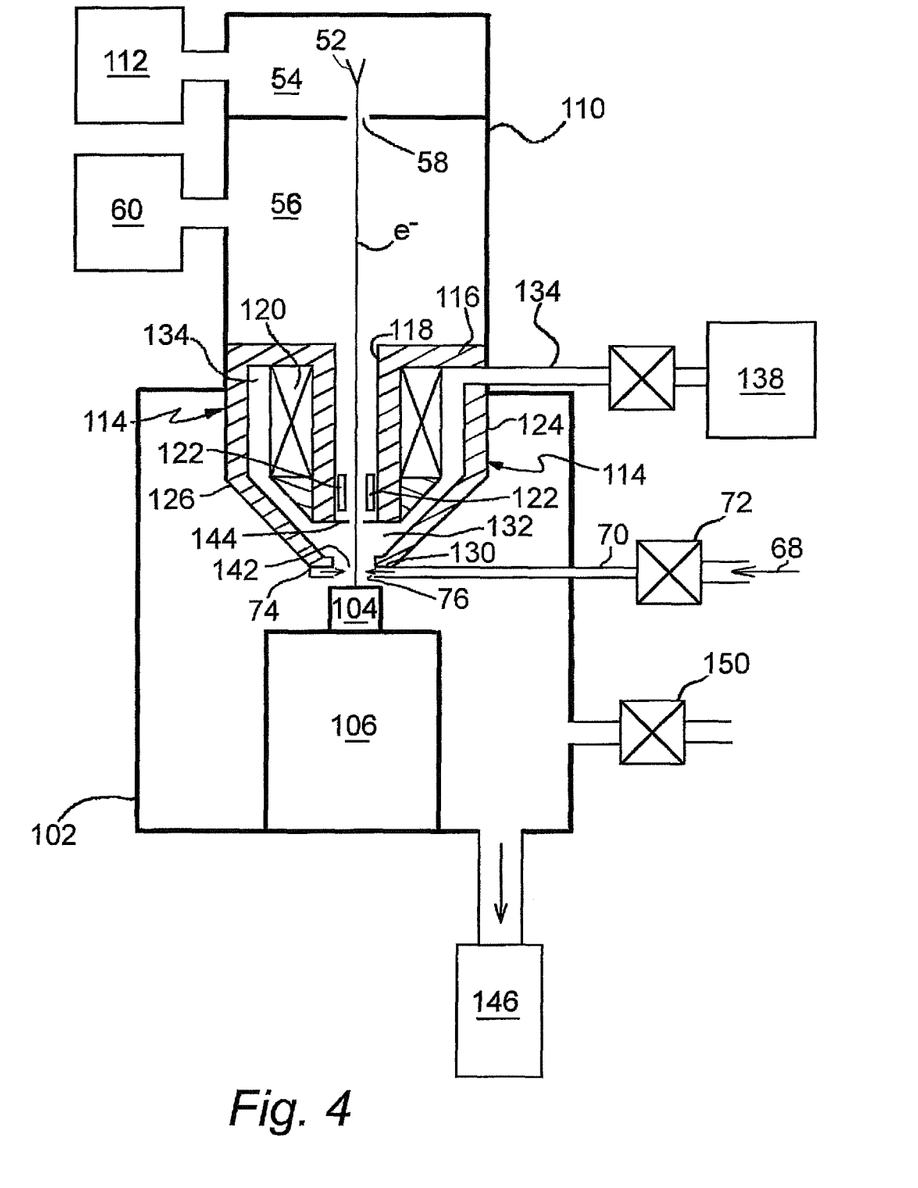
FIG. 4 is a corresponding view of a second embodiment of a microscope in accordance with the invention, in which the gas is introduced through a conduit which extends into the specimen chamber from a region spaced from the lens.

FIG. 4 shows a second embodiment of device in accordance with the invention which, again, shares many common features with the device shown in FIG. 2, those features being denoted by the reference numerals used in FIG. 2.

In this particular case, the device is modified by the inclusion of a gas source 68 connected to a conduit 70 via a valve 72. The gas source 68 is of the same nature as the source 62. The conduit 70 extends horizontally into the chamber 102 at a level immediately below the bottom of the lower pole piece 130 of the lens 114. The conduit 70 terminates in a ring shaped outlet device 74, the inner periphery of which is open to constitute an annular outlet port 76 which is substantially coaxial with the opening 142. The operation of the device is very similar to that of the device shown in FIG. 3, with the valve 72 and pump 146 being used to control the pressure of gas in the chamber 102 and to allow that pressure to be maintained in the range 1 Pa-400 Pa. Furthermore, the gas exiting the outlet port 76 sets up a flow of gas towards the sample 104 and this, again, prevents any gas in the sample from penetrating through the opening 142, so that any such gas will not come into contact with the aperture 144.

Figure 5:
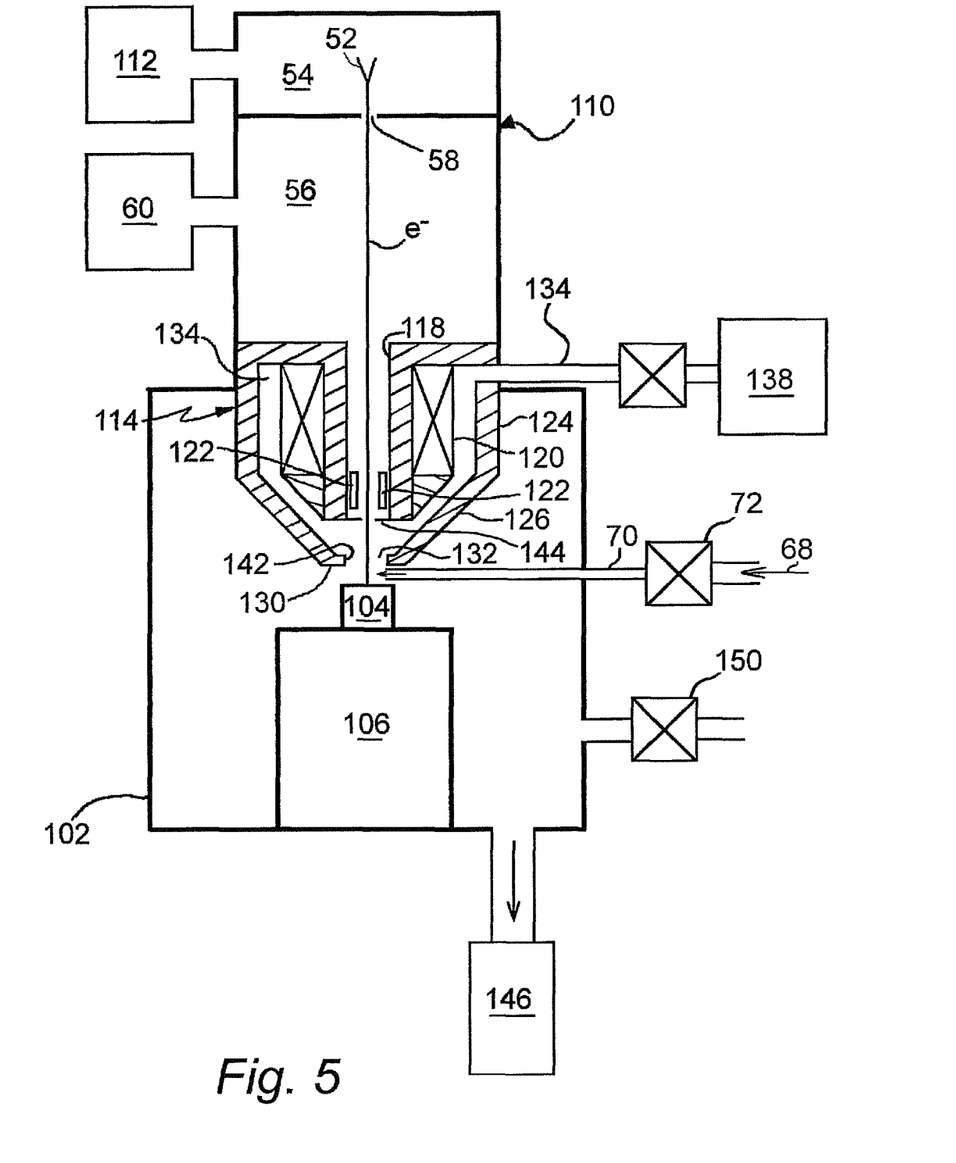
FIG. 5 is a corresponding view of a third embodiment of a microscope in accordance with the invention, which differs from the FIG. 4 embodiment in the form of the outlet of the conduit.

Turning to FIG. 5, the third embodiment of device in accordance with the invention is very similar to the device shown in FIG. 4, and corresponding components of that device are denoted by the reference numerals shown in FIG. 4. In fact, the only difference in respect of the device shown in FIG. 5 lies in the position and termination of the conduit 70 for the gas. As can be seen from the Figure, the conduit in this case is slightly spaced from the lower pole piece 130, and is not connected to any other outlet device. Incidentally, the outlet for the gas from the conduit 70 is constituted by the open end thereof. However, the flow of gas from the open end of the conduit 70 has the same effect as the flow of gas from the outlet port 76 of the device shown in FIG. 4.

In the embodiments described above, the charged particle beam system is an electron beam system, i.e. the charged particles are electrons. However in other embodiments of the invention other kinds of charged particles can be used, especially positively charged particles such as ions or positrons. In the case of an ion beam system the design principles of the charged particle beam system are very similar to the ones described above but with the difference that instead of an electron source an ion source is provided and that instead of a magnetic objective lens an electrostatic lens is provided. The electrodes of the electrostatic lens then also can form the pressure limiting apertures. In alternative embodiments the pressure limiting apertures are realised by apertures in addition to the electrodes of the electrostatic objective lens. A particular ion source can be a gas field ion source, in particular a He-ion gas field ion source.

The invention claimed is:

1. A charged particle beam device comprising:
 beam generating apparatus for generating a focussed charged particle beam; a specimen chamber for containing a specimen to interact with the beam in a gaseous environment; a pressure limiting aperture for providing partial gaseous isolation of the specimen chamber from the beam generating apparatus, the beam generating apparatus having a lens for focussing the beam which lens includes an intermediate chamber, wherein the device further includes a gas inlet for enabling gas to be supplied to the intermediate chamber to set up a flow of gas from the lens towards the specimen, thereby to prevent material released from the specimen from impinging on the pressure limiting aperture; and wherein the device further comprises a valve for allowing gas to enter the specimen chamber and a system control for adjusting said valve, the system control being configured to adjust the valve to maintain in the specimen chamber an average gas pressure in a range of 1 Pa to 400 Pa.

2. A device according to claim 1 in which the lens is so shaped that at least part of said flow of gas impinges directly on at least part of the specimen.

3. A device according to claim 1, in which the device is a scanning beam device, the beam generating apparatus including one or more scanning elements for scanning the beam over a specimen in the specimen chamber.

4. A device according to claim 1, in which the lens comprises an assembly having an upper pole piece and a lower pole piece, the pole pieces being spaced from each other to enable the assembly to accommodate the intermediate chamber.

5. A device according to claim 4, in which the intermediate chamber is situated below the upper pole piece.

6. A device according to claim 4, in which the pole pieces define the intermediate chamber.

7. A device according to claim 1, in which the intermediate chamber is annular.

8. A device according to claim 1, in which the intermediate chamber is interposed between the pressure limiting aperture and a beam outlet opening, through which the beam exits the lens, and through which the gas flows from the intermediate chamber and into the specimen chamber.

9. A device according to claim 8, in which the beam outlet opening is able to receive a second, downstream pressure limiting aperture, and the intermediate chamber is connectable to a vacuum pump operable to maintain the pressure of gas in the intermediate chamber at a level lower than that in the specimen chamber but higher than that in the portion of the beam generating apparatus upstream of the pressure limiting aperture.

10. A device according to claim 1, in which the gas inlet comprises a valve connected between the intermediate chamber and a gas source.

11. A device according to claim 1, in which the intermediate chamber has a substantially constant cross sectional area at least in the region extending from the location at which the gas is introduced to the location at which gas flows out of the lens.

12. A device according to claim 1, in which the device comprises a scanning electron microscope, in which the beam generating apparatus takes the form of an electron optical column of the microscope.

13. A method of subjecting a specimen to a charged particle beam utilizing a device according to claim 1, the method comprising the steps of:
 (a) maintaining an average gas pressure of at least 1 Pa in the gaseous environment contained by the specimen chamber which also contains a specimen;
 (b) generating a focussed charged particle beam using the beam generating apparatus which is partially gaseously isolated from the specimen chamber by at least one pressure limiting aperture through which the beam passes on its way to the specimen; and
 (c) introducing gas into the specimen chamber through the intermediate chamber, wherein the intermediate chamber has an outlet for said gas situated downstream, in the direction of the beam, from the pressure limiting aperture, to create a flow of gas generally away from the aperture and towards the specimen, so as to prevent material released from the specimen from impinging on the aperture.

14. A method according to claim 13, in which the gas pressure in the intermediate chamber is between 4 and 10 Pa higher than the pressure of gas in the specimen chamber.

15. A device according to claim 1, in which the valve is connected to the gas inlet, and is arranged to admit a controlled amount of gas into the intermediate chamber, thereby to maintain said gas pressure in the specimen chamber.

16. A device according to claim 1, in which the lens has an upper pole piece, a lower pole piece and a pole piece gap between the upper pole piece and the lower pole piece, and wherein the gas inlet comprises a conduit which extends, and opens onto said gap.

17. A method of subjecting a specimen to a charged particle beam, the method comprising the steps of:
 (a) maintaining an average gas pressure of at least 1 Pa in the environment contained by a specimen chamber which also contains a specimen;
 (b) generating a focussed charged particle beam using beam generating apparatus which is partially gaseously isolated from the specimen chamber by at least one pressure limiting aperture through which the beam passes on its way to the specimen, wherein the beam generating apparatus has a lens for focussing the beam which lens includes an intermediate chamber; and
 (c) introducing gas into the intermediate chamber through a conduit having an outlet for said gas situated downstream, in the direction of the beam, from the pressure limiting aperture, to create a flow of gas generally away from the aperture and towards the specimen, so as to prevent material released from the specimen from impinging on the aperture, wherein the introduction of gas into the specimen chamber through said conduit and said outlet is also used to control the gas pressure in the specimen chamber so as to maintain said average pressure in the range 1 Pa to 400 Pa.

18. A method according to claim 17, in which the beam generating apparatus constitutes or is part of an assembly having a final beam outlet opening through which the beam exits the assembly, the gas being introduced through a conduit having an outlet downstream of the beam outlet opening, the flow of gas in the chamber and conduit being subsonic.

19. A method according to claim 18, in which said flow of gas is substantially parallel to said beam and includes the path taken by the beam from the outlet opening of the beam generating apparatus to the specimen.

20. A method according to claim 17, in which the beam does not pass through any supersonic flow of gas in its passage from the pressure limiting aperture to the specimen.

21. A method according to claim 17, in which the flow rate of the gas is 20 slpm.

22. A method according to claim 18, in which the conduit comprises a pipe which extends into the specimen chamber from a position spaced from the beam outlet opening.

23. A method of creating an image of a specimen, comprising performing a method according to claim 17 to create a focussed charged particle beam which is incident on the specimen, causing the scanning of the specimen by the beam, and detecting resultant emissions from the specimen.

* * * * *